(12) United States Patent
Doan et al.

(10) Patent No.: US 8,229,352 B2
(45) Date of Patent: Jul. 24, 2012

(54) WIRELESS ARCHITECTURE FOR 60GHZ

(75) Inventors: Chinh Doan, Santa Clara, CA (US);
Sohrab Emami, San Francisco, CA (US)

(73) Assignee: SiBeam, Inc., Sunnyvale, CA (US)

( * ) Notice: Subject to any disclaimer, the term of this patent is extended or adjusted under 35 U.S.C. 154(b) by 1033 days.

(21) Appl. No.: 12/167,195

(22) Filed: Jul. 2, 2008

(65) Prior Publication Data
US 2009/0061795 A1    Mar. 5, 2009

Related U.S. Application Data

(60) Provisional application No. 60/948,150, filed on Jul. 5, 2007.

(51) Int. Cl.
*H04B 7/24* (2006.01)
(52) U.S. Cl. ............. 455/39; 455/91; 455/120; 473/353
(58) Field of Classification Search ................ 455/39, 455/91, 120, 127.4, 189.1, 209, 112, 216, 455/260, 557, 566; 473/353
See application file for complete search history.

(56) References Cited

U.S. PATENT DOCUMENTS

| | | | | |
|---|---|---|---|---|
| 4,008,443 A | * | 2/1977 | Remy | 331/38 |
| 4,320,356 A | * | 3/1982 | Perdue | 331/11 |
| 5,276,904 A | | 1/1994 | Mutzig et al. | |
| 5,471,652 A | * | 11/1995 | Hulkko | 455/76 |
| 5,495,202 A | * | 2/1996 | Hsu | 327/113 |
| 5,519,885 A | * | 5/1996 | Vaisanen | 455/76 |
| 5,717,403 A | * | 2/1998 | Nelson et al. | 342/357.52 |
| 6,002,721 A | * | 12/1999 | Said et al. | 375/261 |
| 6,895,542 B2 | * | 5/2005 | Smith et al. | 714/746 |
| 7,003,274 B1 | * | 2/2006 | Olip | 455/260 |
| 7,228,154 B2 | * | 6/2007 | Champion et al. | 455/557 |
| 7,310,397 B2 | * | 12/2007 | Smith et al. | 375/355 |
| 7,466,973 B2 | * | 12/2008 | Armbruster et al. | 455/302 |
| 7,483,717 B2 | * | 1/2009 | Champion et al. | 455/557 |
| 7,499,462 B2 | * | 3/2009 | MacMullan et al. | 370/401 |
| 8,002,645 B2 | * | 8/2011 | Savarese et al. | 473/353 |
| 2006/0094374 A1 | * | 5/2006 | Olip | 455/76 |
| 2007/0155520 A1 | * | 7/2007 | Savarese et al. | 473/131 |
| 2008/0181252 A1 | * | 7/2008 | Rofougaran | 370/451 |
| 2008/0318619 A1 | * | 12/2008 | Rofougaran et al. | 455/550.1 |
| 2008/0320285 A1 | * | 12/2008 | Rofougaran et al. | 712/221 |
| 2009/0239483 A1 | * | 9/2009 | Rofougaran | 455/90.2 |

FOREIGN PATENT DOCUMENTS

| | | |
|---|---|---|
| EP | 0 502 449 | 9/1992 |
| WO | WO 01/01562 | 1/2001 |
| WO | WO 2006/031356 | 3/2006 |

OTHER PUBLICATIONS

PCT International Search Report dated Oct. 21, 2008, for PCT/US08/069263, filed Jul. 3, 2008, 5 pages.
Written Opinion of the International Searching Authority dated Oct. 21, 2008, for PCT/US08/069263, filed Jul. 3, 2008, 6 pages.

* cited by examiner

*Primary Examiner* — Minh D Dao
(74) *Attorney, Agent, or Firm* — Blakely Sokoloff Taylor & Zafman LLP.

(57) ABSTRACT

A device has an RF mixer, an IF mixer module, a single synthesizer, a frequency divider, a single side band mixer and a frequency quadrupler. The single synthesizer generates a signal to the IF mixer module, the frequency divider, and the single side band mixer. The single side band mixer mixes signals from the single synthesizer and the frequency divider. The frequency quadrupler receives the output of the single side band mixer. The RF mixer is coupled to the frequency quadrupler and the IF mixer module.

29 Claims, 4 Drawing Sheets

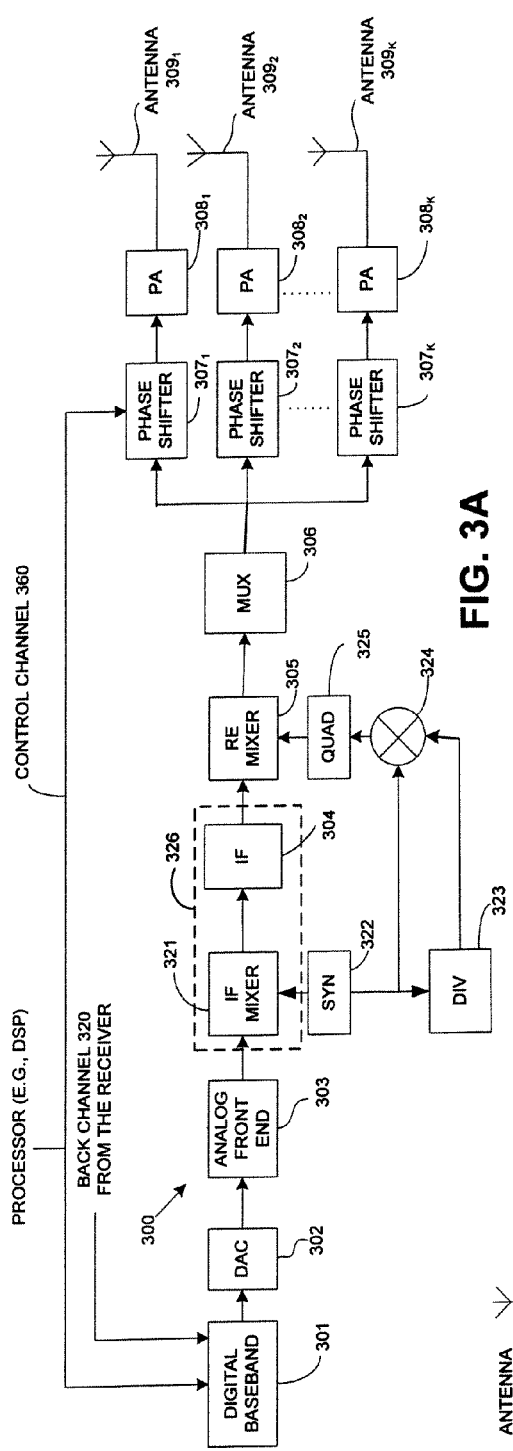
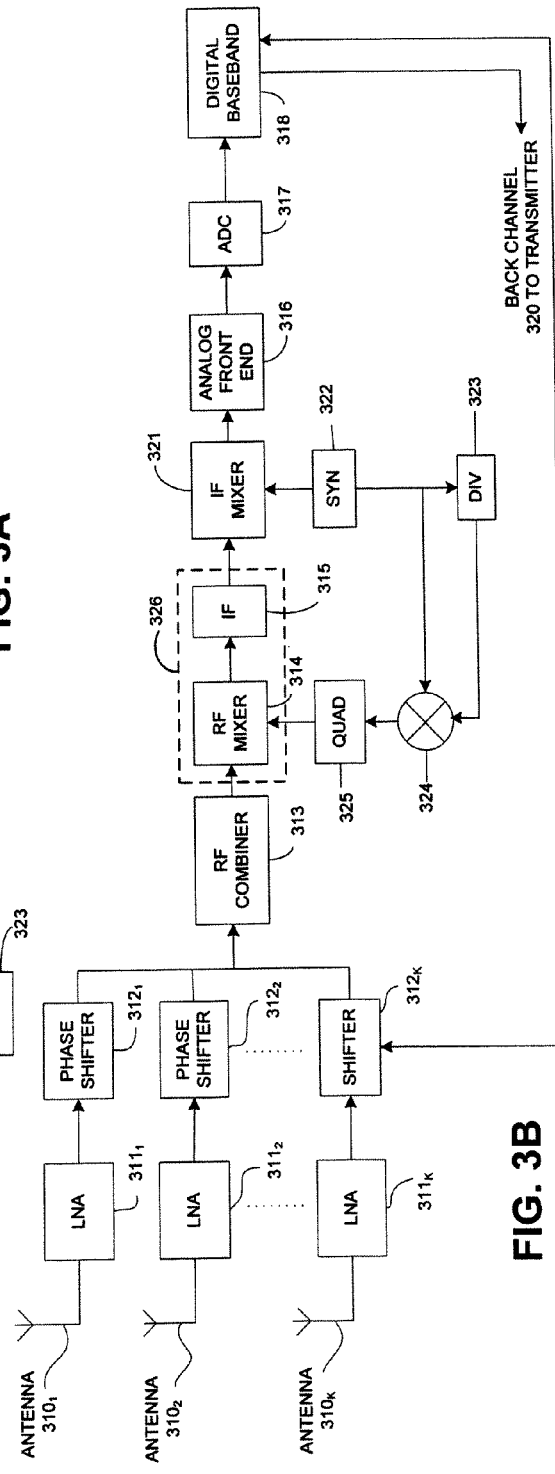
FIG. 3A
FIG. 3B

WIRELESS ARCHITECTURE FOR 60GHZ

RELATED APPLICATIONS

This application claims the benefit of U.S. Provisional Application No. 60/948,150 filed Jul. 5, 2007.

FIELD OF THE INVENTION

The present invention relates to the field of wireless communication; more particularly, the present invention relates to a wireless communication device.

BACKGROUND OF THE INVENTION

In 1998, the Digital Display Working Group (DDWG) was formed to create a universal interface standard between computers and displays to replace the analog VGA connection standard. The resulting standard was the Digital Visual Interface (DVI) specification, released in April 1999. There are a number of content protection schemes available. For example, HDCP and DTCP are well-known content protection schemes. HDCP was proposed as a security component for DVI and was designed for digital video monitor interfaces.

HDMI is a connection interface standard that was developed to meet the explosive demand for high-definition audio and video. HDMI is capable of carrying video and audio and is backward-compatible with DVI (which carries only video signals). The key advantage of DVI and HDMI is that both of them are capable of transmitting uncompressed high-definition digital streams via a single cable.

HDCP is a system for protecting content being transferred over DVI and HDMI from being copied. See HDCP 1.0 for details. HDCP provides authentication, encryption, and revocation. Specialized circuitry in the playback device and in the display monitor encrypts video data before it is sent over. With HDCP, content is encrypted immediately before (or inside) the DVI or HDMI transmitter chip and decrypted immediately after (or inside) the DVI or HDMI receiver chip.

In addition to the encryption and decryption functions, HDCP implements authentication to verify that the receiving device (e.g., a display, a television, etc.) is licensed to receive encrypted content. Re-authentication occurs approximately every two seconds to continuously confirm the security of the DVI or HDMI interface. If, at any time, re-authentication does not occur, for example by disconnecting a device and/or connecting an illegal recording device, the source device (e.g., a DVD player, a set-top box, etc.) ends transmission of encrypted content.

While discussions of HDMI and DVI are generally focused on wired communication, the use of wireless communication to transmit content has become more prevalent every day. While much of the current focus is on cellular technologies and wireless networks, there has been a growing interest in the unlicensed spectrum around 60 GHz for wireless video transmission or very high-speed networking. More specifically, seven GHz of contiguous bandwidth has been opened for unlicensed use at millimeter-wave frequencies around 60 GHz in the U.S. and Japan.

SUMMARY OF THE INVENTION

A device has an RF mixer, an IF mixer module, a single synthesizer, a frequency divider, a single side band mixer and a frequency quadrupler. The single synthesizer generates a signal to the IF mixer module, the frequency divider, and the single side band mixer. The single side band mixer mixes signals from the single synthesizer and the divider. The frequency quadrupler receives the output of the single side band mixer. The RF mixer is coupled to the frequency quadrupler and the IF mixer module.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 3A is a block diagram of one embodiment of a transmitter device.

FIG. 3B is a block diagram of one embodiment of a receiver device.

DETAILED DESCRIPTION OF THE PRESENT INVENTION

An apparatus and method for wireless communication is disclosed. In one embodiment, the wireless communication occurs using a wireless transceiver with or without an adaptive beamforming antenna. As would be apparent to one skilled in the art, the wireless communication could occur with a wireless receiver or transmitter. Those of ordinary skills in the art will recognize that the generation circuit described in the wireless transceiver may be applicable to many types of wireless networks such as wireless video network, wireless personal network, wireless local network among others.

In one embodiment, the wireless communication includes an additional link, mode, or channel, for transmitting information between a transmitter and a receiver. The link may be uni-directional or bi-directional. In one embodiment, the channel is used to send antenna information back from a receiver to a transmitter to enable the transmitter to adapt its antenna array by steering the antenna elements to find a path to another direction. This may be obstacle avoidance.

In one embodiment, the link is also used to transfer information corresponding to the content that is being transferred wirelessly (e.g., wireless video). This information may be content protection information. For example, in one embodiment, the link is used to transfer encryption keys and acknowledgements of encryption keys when the transceivers are transferring HDMI data. Thus, in one embodiment, the link transfers control information and content protection information.

Figure 1:
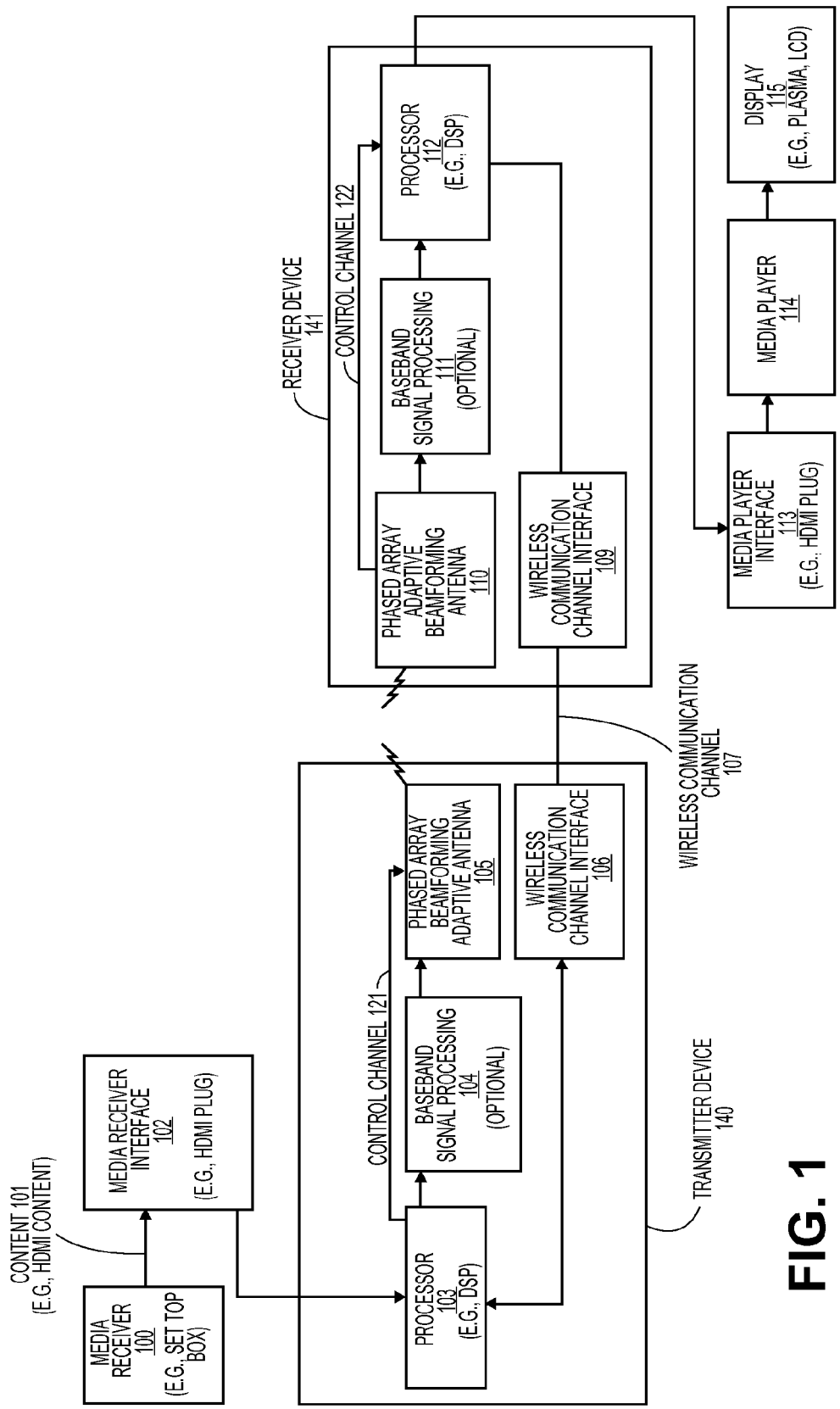
FIG. 1 is a block diagram of one embodiment of a communication system.

FIG. 1 is a block diagram of one embodiment of a communication system. Referring to FIG. 1, the system comprises media receiver 100, a media receiver interface 102, a transmitting device 140, a receiving device 141, a media player interface 113, a media player 114 and a display 115.

Media receiver 100 receives content from a source (not shown). In one embodiment, media receiver 100 comprises a high-definition source, for example, such as a set top box. The content may comprise baseband digital video, such as, for example, but not limited to, content adhering to the HDMI or DVI standards. In such a case, media receiver 100 may include a transmitter (e.g., an HDMI transmitter) to forward the received content.

Media receiver 100 sends content 101 to transmitter device 140 via media receiver interface 102. In one embodiment, media receiver interface 102 includes logic that converts content 101 into HDMI content. In such a case, media receiver interface 102 may comprise an HDMI plug and content 101 is sent via a wired connection; however, the transfer could occur through a wireless connection. In another embodiment, content 101 comprises DVI content.

In one embodiment, the transfer of content 101 between media receiver interface 102 and transmitter device 140 occurs over a wired connection; however, the transfer could occur through a wireless connection.

Transmitter device 140 wirelessly transfers information to receiver device 141 using two wireless connections. One of the wireless connections is through a phased array antenna with adaptive beamforming, also referred as High Rate Channel. The other wireless connection is via wireless communications channel 107, referred to herein as the Low Rate channel. In another embodiment, the HR and LR wireless communication are enabled through a MAC, and a PHY (discussed in FIG. 2).

Receiver device 141 transfers the content received from transmitter device 140 to media player 114 via media player interface 113. In one embodiment, the transfer of the content between receiver device 141 and media player interface 113 occurs through a wired connection; however, the transfer could occur through a wireless connection. In one embodiment, media player interface 113 comprises an HDMI plug. Similarly, the transfer of the content between media player interface 113 and media player 114 occurs through a wired connection; however, the transfer could occur through a wireless connection.

Media player 114 causes the content to be played on display 115. In one embodiment, the content is HDMI content and media player 114 transfer the media content to display via a wired connection; however, the transfer could occur through a wireless connection. Display 115 may comprise a plasma display, an LCD, a CRT, etc.

Note that the system in FIG. 1 may be altered to include a DVD player/recorder in place of a DVD player/recorder to receive, and play and/or record the content.

In one embodiment, transmitter 140 and media receiver interface 102 are part of media receiver 100. Similarly, in one embodiment, receiver 141, media player interface 113, and media player 114 are all part of the same device. In an alternative embodiment, receiver 140, media player interface 113, media player 114, and display 115 are all part of the display.

In one embodiment, transmitter device 140 comprises a processor 103, a baseband processing component 104, a phased array antenna 105, and a wireless communication channel interface 106. Phased array antenna 105 comprises a radio frequency (RF) transmitter having a digitally controlled phased array antenna coupled to and controlled by processor 103 to transmit content to receiver device 141 using adaptive beamforming.

In one embodiment, receiver device 141 comprises a processor 112, a baseband processing component 111, a phased array antenna 110, and a wireless communication channel interface 109. Phased array antenna 110 comprises a radio frequency (RF) transmitter having a digitally controlled phased array antenna coupled to and controlled by processor 112 to receive content from transmitter device 140 using adaptive beamforming.

In one embodiment, processor 103 generates signals that are processed by baseband signal processing 104 prior to being wirelessly transmitted by phased array antenna 105. In such a case, receiver device 141 includes baseband signal processing to convert analog signals received by phased array antenna 110 into baseband signals for processing by processor 112. In one embodiment, the baseband signals are orthogonal frequency division multiplex (OFDM) signals. In one embodiment, the baseband signals are single carrier phase, amplitude, or both phase and amplitude modulated signals.

In one embodiment, transmitter device 140 and/or receiver device 141 are part of separate transceivers.

Transmitter device 140 and receiver device 141 perform wireless communication using phased array antenna with adaptive beamforming that allows beam steering. Beamforming is well known in the art. In one embodiment, processor 103 sends digital control information to phased array antenna 105 to indicate an amount to shift one or more phase shifters in phased array antenna 105 to steer a beam formed thereby in a manner well-known in the art. Processor 112 uses digital control information as well to control phased array antenna 110. The digital control information is sent using control channel 121 in transmitter device 140 and control channel 122 in receiver device 141. In one embodiment, the digital control information comprises a set of coefficients. In one embodiment, each of processors 103 and 112 comprises a digital signal processor.

Wireless communication link interface 106 is coupled to processor 103 and provides an interface between wireless communication link 107 and processor 103 to communicate antenna information relating to the use of the phased array antenna and to communicate information to facilitate playing the content at another location. In one embodiment, the information transferred between transmitter device 140 and receiver device 141 to facilitate playing the content includes encryption keys sent from processor 103 to processor 112 of receiver device 141 and one or more acknowledgments from processor 112 of receiver device 141 to processor 103 of transmitter device 140.

Wireless communication link 107 also transfers antenna information between transmitter device 140 and receiver device 141. During initialization of the phased array antennas 105 and 110, wireless communication link 107 transfers information to enable processor 103 to select a direction for the phased array antenna 105. In one embodiment, the information includes, but is not limited to, antenna location information and performance information corresponding to the antenna location, such as one or more pairs of data that include the position of phased array antenna 110 and the signal strength of the channel for that antenna position. In another embodiment, the information includes, but is not limited to, information sent by processor 112 to processor 103 to enable processor 103 to determine which portions of phased array antenna 105 to use to transfer content.

When the phased array antennas 105 and 110 are operating in a mode during which they may transfer content (e.g., HDMI content), wireless communication link 107 transfers an indication of the status of communication path from the processor 112 of receiver device 141. The indication of the status of communication comprises an indication from processor 112 that prompts processor 103 to steer the beam in another direction (e.g., to another channel). Such prompting may occur in response to interference with transmission of portions of the content. The information may specify one or more alternative channels that processor 103 may use.

In one embodiment, the antenna information comprises information sent by processor 112 to specify a location to which receiver device 141 is to direct phased array antenna 110. This may be useful during initialization when transmitter device 140 is telling receiver device 141 where to position its antenna so that signal quality measurements can be made to identify the best channels. The position specified may be an exact location or may be a relative location such as, for example, the next location in a predetermined location order being followed by transmitter device 140 and receiver device 141.

In one embodiment, wireless communications link 107 transfers information from receiver device 141 to transmitter device 140 specifying antenna characteristics of phased array antenna 110, or vice versa. These antenna characteristics may include phase and/or magnitude vectors used for steering the beam.

Figure 2:
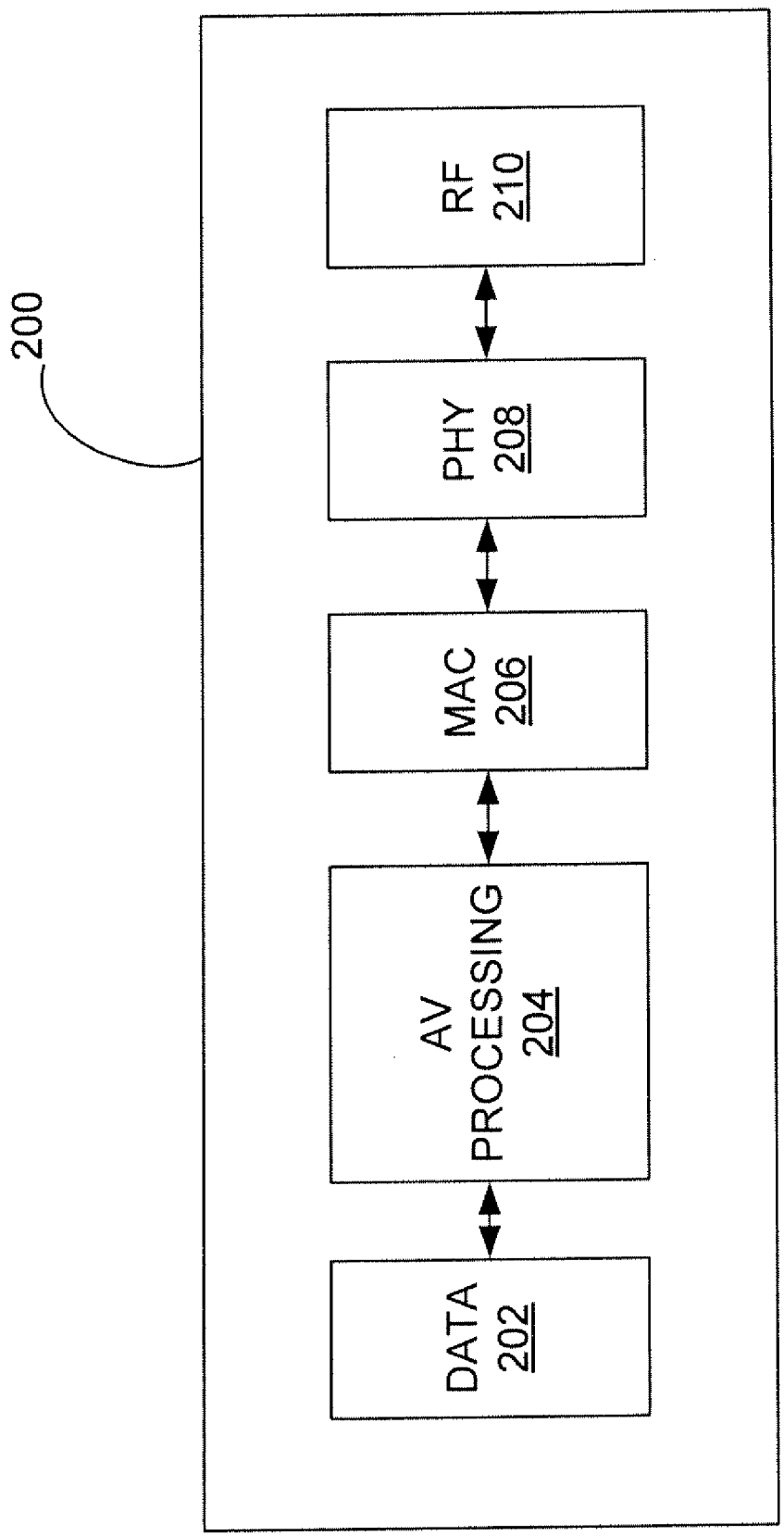
FIG. 2 is a block diagram of one embodiment of a communication device.

FIG. 2 illustrates one embodiment of a communication device 200. The communication device 200 includes data storage 202, an Audio/Video (AV) processor 204, a media access controller (MAC) 206, a physical device interface (PHY) 208, and a radio frequency RF module 210. Data storage 202 may store any types of data. For example, data storage 202 may store audio and video data as well as other types of data. AV processor 204 receives and processes data from data storage 202. MAC 206 handles generating and parsing physical frames. PHY 208 handles how this data is actually moved to/from the radio module 210. As an example, Wireless HD specification supports two basic types of PHY: high rate PHY (HRP) and low rate PHY (LRP).

One embodiment of a transceiver is described below. The transceiver includes transmit and receive paths for a transmitter and receiver, respectively. In one embodiment, the transmitter, for use in communication with a receiver, comprises a processor and a phased array beamforming antenna. The processor controls the antenna to perform adaptive beam steering using multiple transmit antennas in conjunction with receive antennas of the receiver by iteratively performing a set of training operations. One of the training operations comprises the processor causing the phased array beamforming antenna to transmit a first training sequence while a receive antenna-array weight vector of the receiver is set and a transmitter antenna-array weight vector switches between weight vectors with a set of weight vectors. Another of the training operations comprises the processor causing the phased array beamforming antenna to transmit a second training sequence while a transmitter antenna-array weight vector is set as part of a process to calculate the receive antenna-array weight vector.

In one embodiment, the receiver, for use in communication with a transmitter, comprises a processor and a phased array beamforming antenna. The processor controls the antenna to perform adaptive beam steering using multiple receive antennas in conjunction with transmit antennas of the transmitter by iteratively performing a set of training operations. One of the training operations comprises the processor setting a receive antenna-array weight vector during a process for estimating a transmit antenna-array weight vector by having the transmitter transmit a first training sequence while the receive antenna-array weight vector is set. Another of the training operations comprises the processor calculate the receive antenna-array weight vector when the transmitter transmits a second training sequence while the transmitter antenna-array weight vector is set.

FIGS. 3A and 3B are block diagrams of one embodiment of a transmitter device and a receiver device, respectively, that are part of a radio system as illustrated in FIG. 1. Transceiver 300 in FIGS. 3A and 3B includes multiple independent transmit and receive chains and performs phased array beam forming using a phased array that takes an identical RF signal and shifts the phase for one or more antenna elements in the array to achieve beam steering.

Referring to FIG. 3A, digital baseband processing module (e.g., Digital Signal Processor (DSP)) 301 formats the content and generates real time baseband signals. Digital baseband processing module 301 may provide modulation, FEC coding, packet assembly, interleaving and automatic gain control.

Digital baseband processing module 301 then forwards the baseband signals to be modulated and sent out on the RF portion of the transmitter. In one embodiment, the content is modulated into OFDM signals in a manner well known in the art.

Digital-to-analog converter (DAC) 302 receives the digital signals output from digital baseband processing module 301 and converts them to analog signals. In one embodiment, the signal outputs from DAC 302 are between 0-1.7 GHz. Analog front end 303 receives the analog signals and filters it with an appropriate low-pass image-rejection filter and amplifies it accordingly.

In one embodiment, an IF mixer module 326 receives the output signal of analog front end 303. The IF mixer module 326 is configured to generate a fixed intermediate frequency to RF mixer 305. As an example, IF mixer module 326 includes an IF mixer 321 and an IF module 304. In one embodiment, IF module 304 includes a bandpass filter. In another embodiment, IF module 304 includes an IF tuned amplifier. IF mixer 321 receives the output of analog front end 303 and a single frequency synthesizer 322 and up-converts it to the IF frequency. IF module 304 receives the output of IF mixer 321. Those of ordinary skills in the art will recognize that other components may be used to perform similar functions of IF mixer module 326. For example, the IF mixer module 326 may include an IF filter.

In one embodiment, the generation circuit as presently described includes only one single frequency synthesizer 322 with an oscillating frequency of 12.96 GHz.

A programmable divider 323 and a single side band mixer 324 receive the output of the single frequency synthesizer 322. In one embodiment, programmable divider 323 divides with multiple of two (e.g. 8, 12, 24). Single side band mixer 324 also receives the output of programmable divider 323. In one embodiment, single side band mixer 324 outputs the following frequencies: 11.34 GHz, 11.88 GHz, 12.42 GHz, and 12.96 GHz.

A quadrupler 325 receives the output of single side band mixer 324. Those of ordinary skills in the art will recognize that quadrupler 325 may includes different components when combined perform the same function. For example, quadrupler 325 can include two frequency doublers. The quadrupler 325 is described here as an example. In another embodiment, a frequency multiplier may be used. The frequency multiplier may include a quadrupler or a doubler.

One embodiment of coupling a mixer with a frequency multiplier is to couple a sub-harmonic mixer with a frequency multiplier at a lower multiplication factor or to just use a sub-harmonic mixer.

RF mixer 305 receives signals output from IF mixer module 326 and combines them with the signal from quadrupler 325. The signals output from RF mixer 305 are at a radio frequency. In one embodiment, the radio frequency of the signal output of RF mixer 305 is 58.32 GHz, 60.48 GHz, 62.64 GHz, and 64.8 GHz.

Multiplexer 306 is coupled to receive the output from RF mixer 305 to control which phase shifters $307_{1-N}$ receive the signals. In one embodiment, phase shifters $307_{1-N}$ are quantized phase shifters. In an alternative embodiment, phase shifters $307_{1-N}$ may be replaced by IF or RF amplifiers with controllable gain and phase. In one embodiment, digital baseband processing module 201 also controls, via control channel 360, the phase and magnitude of the currents in each of the antenna elements in phased array antenna to produce a desired beam pattern in a manner well-known in the art. In other words, digital baseband processing module 201 controls the phase shifters $307_{1-N}$ of phased array antenna to produce the desired pattern.

Each of phase shifters $307_{1-N}$ produce an output that is sent to one of power amplifiers $308_{1-N}$, which amplify the signal. The amplified signals are sent to an antenna array that has multiple antenna elements $309_{1-N}$. In one embodiment, the signals transmitted from antennas $309_{1-N}$ are radio frequency signals between 56-64 GHz. In one embodiment, the radio frequency signals center at 58.32 GHz, 60.48 GHz, 62.64 GHz, and 64.8 GHz. Thus, multiple beams are output from the phased array antenna.

With respect to the receiver in FIG. 3B, antennas $310_{1-K}$ receive the wireless transmissions from antennas $309_{1-N}$ and provide them to phase shifters $312_{1-K}$, via low-noise amplifiers $311_{1-N}$, respectively. As discussed above, in one embodiment, phase shifters $312_{1-K}$ comprise quantitized phase shifters. Alternatively, phase shifters $312_{1-K}$ may be replaced by complex multipliers. Phase shifters $312_{1-N}$ receive the signals from antennas $310_{1-K}$, which are combined by RF combiner 313 to form a single line feed output. In one embodiment, a multiplexer is used to combine the signals from the different elements and output the single feed line. RF Mixer 314 receives the output of RF combiner 313.

RF Mixer 314 receives the output signal of RF combiner 313 and combines it with a signal from frequency quadrupler 325. In one embodiment, the output of RF mixer 314 is an IF signal that a IF mixer module 326 down-converts to the baseband frequency. In one embodiment, the radio frequency of input signal to RF mixer 314 centers at 58.32 GHz, 60.48 GHz, 62.64 GHz, or 64.8 GHz.

In one embodiment, frequency quadrupler 325 receives the output of mixer 324 at one of the frequencies of 11.34 GHz, 11.88 GHz, 12.42 GHz, 12.96 GHz. Mixer 324 receives the output of a programmable divider 323 and single synthesizer 322 operating at 12.96 GHz. Single synthesizer 322 also generates an output signal to IF mixer module 326.

In one embodiment, IF mixer module 326 includes an IF module 315 and an IF mixer 321. In one embodiment, IF module 315 includes a bandpass filter. In another embodiment, IF module 315 includes an IF tuned amplifier. Analog front end 316 receives the output signal of IF mixer module 326.

Analog-to-digital converter (ADC) 317 receives the output of analog front end 316 and converts it to digital form. The digital output from ADC 317 is received by digital baseband processing module (e.g., DSP) 318. Digital baseband processing module 318 restores the amplitude and phase of the signal. Digital baseband processing module 318 may provide demodulation, packet disassembly, de-interleaving and automatic gain.

In one embodiment, each of the transceivers includes a controlling microprocessor that sets up control information for the digital baseband processing module (e.g., DSP). The controlling microprocessor may be on the same die as the digital baseband processing module (e.g., DSP).

DSP-controlled Adaptive Beam Forming

In one embodiment, the DSPs implement an adaptive algorithm with the beam forming weights being implemented in hardware. That is, the transmitter and receiver work together to perform the beam forming in RF frequency using digitally controlled analog phase shifters; however, in an alternative embodiment, the beam-forming is performed in IF. Phase shifters $307_{1-N}$ and $312_{1-N}$ are controlled via control channel 360 and control channel 370, respectfully, via their respective DSPs in a manner well known in the art. For example, digital baseband processing module (e.g., DSP) 301 controls phase shifters $307_{1-N}$ to have the transmitter perform adaptive beam-forming to steer the beam while digital baseband processing module (e.g., DSP) 318 controls phase shifters $312_{1-N}$ to direct antenna elements to receive the wireless transmission from antenna elements and combine the signals from different elements to form a single line feed output. In one embodiment, a multiplexer is used to combine the signals from the different elements and output the single feed line. Note that processors (e.g., DSPs) that control the digital baseband processing modules, such as shown in the transmitters and receivers of FIG. 1, could be coupled to control channels 360 and 370, respectively, could be used to control phase shifters $307_{1-N}$ and $312_{1-N}$.

Digital baseband processing module (e.g., DSP) 301 performs the beam steering by pulsing, or energizing, the appropriate phase shifter connected to each antenna element. The pulsing algorithm under digital baseband processing module (e.g., DSP) 301 controls the phase and gain of each element. Performing DSP controlled phase array beam-forming is well known in the art.

The adaptive beam forming antenna is used to avoid interfering obstructions. By adapting the beam forming and steering the beam, the communication can occur avoiding obstructions which may prevent or interfere with the wireless transmissions between the transmitter and the receiver.

In one embodiment, with respect to the adaptive beam-forming antennas, they have three phases of operations. The three phases of operations are the training phase, a searching phase, and a tracking phase. The training phase and searching phase occur during initialization. The training phase determines the channel profile with predetermined sequences of spatial patterns $\{A\hat{i}\}$ and $\{B\hat{j}\}$. The searching phase computes a list of candidate spatial patterns $\{A\hat{i}\}, \{B\hat{j}\}$ and selects a prime candidate $\{A\overline{0}, B\overline{0}\}$ for use in the data transmission between the transmitter of one transceiver and the receiver of another. The tracking phase keeps track of the strength of the candidate list. When the prime candidate is obstructed, the next pair of spatial patterns is selected for use.

In one embodiment, during the training phase, the transmitter sends out a sequence of spatial patterns $\{A\hat{i}\}$. For each spatial pattern $\{A\hat{i}\}$, the receiver projects the received signal onto another sequence of patterns $\{B\hat{j}\}$. As a result of the projection, a channel profile is obtained over the pair $\{A\hat{i}\}$, $\{B\hat{j}\}$.

In one embodiment, an exhaustive training is performed between the transmitter and the receiver in which the antenna of the receiver is positioned at all locations and the transmitter sending multiple spatial patterns. Exhaustive training is well-known in the art. In this case, M transmit spatial patterns are transmitted by the transmitter and N received spatial patterns are received by the receiver to form an N by M channel matrix. Thus, the transmitter goes through a pattern of transmit sectors and the receiver searches to find the strongest signal for that transmission. Then the transmitter moves to the next sector. At the end of the exhaustive search process, a ranking of all the positions of the transmitter and the receiver and the signals strengths of the channel at those positions has been obtained. The information is maintained as pairs of positions of where the antennas are pointed and signal strengths of the channels. The list may be used to steer the antenna beam in case of interference.

In an alternative embodiment, subspace training is used in which the space is divided in successively narrow sections with orthogonal antenna patterns being sent to obtain a channel profile.

Assuming digital baseband processing module 301 (DSP) is in a stable state and the direction the antenna should point is already determined. In the nominal state, the DSP will have a set of coefficients that it sends to the phase shifters. The coefficients indicate the amount of phase the phase shifter is to shift the signal for its corresponding antennas. For example, digital baseband processing module 301 (DSP) sends a set digital control information to the phase shifters that indicate the different phase shifters are to shift different amounts, e.g., shift 30 degrees, shift 45 degrees, shift 90 degrees, shift 180 degrees, etc. Thus, the signal that goes to that antenna element will be shifted by a certain number of degrees of phase. The end result of shifting, for example, 16, 32, 36, 64 elements in the array by different amounts enables the antenna to be steered in a direction that provides the most sensitive reception location for the receiving antenna. That is, the composite set of shifts over the entire antenna array provides the ability to stir where the most sensitive point of the antenna is pointing over the hemisphere.

Note that in one embodiment the appropriate connection between the transmitter and the receiver may not be a direct path from the transmitter to the receiver. For example, the most appropriate path may be to bounce off the ceiling.

The Back Channel

In one embodiment, the wireless communication system includes a back channel 320, or link, for transmitting information between wireless communication devices (e.g., a transmitter and receiver, a pair of transceivers, etc.). The information is related to the beam-forming antennas and enables one or both of the wireless communication devices to adapt the array of antenna elements to better direct the antenna elements of a transmitter to the antenna elements of the receiving device together. The information also includes information to facilitate the use of the content being wirelessly transferred between the antenna elements of the transmitter and the receiver.

In FIGS. 3A and 3B, back channel 320 is coupled between digital baseband processing module (DSP) 318 and digital baseband processing module (DSP) 301 to enable digital baseband processing module (DSP) 318 to send tracking and control information to digital baseband processing module (DSP) 301. In one embodiment, back channel 320 functions as a high speed downlink and an acknowledgement channel.

In one embodiment, the back channel is also used to transfer information corresponding to the application for which the wireless communication is occurring (e.g., wireless video). Such information includes content protection information. For example, in one embodiment, the back channel is used to transfer encryption information (e.g., encryption keys and acknowledgements of encryption keys) when the transceivers are transferring HDMI data. In such a case, the back channel is used for content protection communications.

More specifically, in HDMI, encryption is used to validate that the data sink is a permitted device (e.g., a permitted display). There is a continuous stream of new encryption keys that is transferred while transferring the HDMI datastream to validate that the permitted device hasn't changed. Blocks of frames for the HD TV data are encrypted with different keys and then those keys have to be acknowledged back on back channel 320 in order to validate the player. Back channel 220 transfers the encryption keys in the forward direction to the receiver and acknowledgements of key receipts from the receiver in the return direction. Thus, encrypted information is sent in both directions.

The use of the back channel for content protection communications is beneficial because it avoids having to complete a lengthy retraining process when such communications are sent along with content. For example, if a key from a transmitter is sent alongside the content flowing across the primary link and that primary link breaks, it will force a lengthy retrain of 2-3 seconds for a typical HDMI/HDCP system. In one embodiment, this separate bi-directional link that has higher reliability than the primary directional link given its omni-directional orientation. By using this back channel for communication of the HDCP keys and the appropriate acknowledgement back from the receiving device, the time consuming retraining can be avoided even in the event of the most impactful obstruction.

In the active mode, when the beam-forming antennas are transferring content, the back channel is used to allow the receiver to notify the transmitter about the status of the channel. For example, while the channel between the beam-forming antennas is of sufficient quality, the receiver sends information over the back channel to indicate that the channel is acceptable. The back channel may also be used by the receiver to send the transmitter quantifiable information indicating the quality of the channel being used. If some form of interference (e.g., an obstruction) occurs that degrades the quality of the channel below an acceptable level or prevents transmissions completely between the beam-forming antennas, the receiver can indicate that the channel is no longer acceptable and/or can request a change in the channel over the back channel. The receiver may request a change to the next channel in a predetermined set of channels or may specify a specific channel for the transmitter to use.

In one embodiment, the back channel is bi-directional. In such a case, in one embodiment, the transmitter uses the back channel to send information to the receiver. Such information may include information that instructs the receiver to position its antenna elements at different fixed locations that the transmitter would scan during initialization. The transmitter may specify this by specifically designating the location or by indicating that the receiver should proceed to the next location designated in a predetermined order or list through which both the transmitter and receiver are proceeding.

In one embodiment, the back channel is used by either or both of the transmitter and the receiver to notify the other of specific antenna characterization information. For example, the antenna characterization information may specify that the antenna is capable of a resolution down to 6 degrees of radius and that the antenna has a certain number of elements (e.g., 32 elements, 64 elements, etc.).

In one embodiment, communication on the back channel is performed wirelessly by using interface units. Any form of wireless communication may be used. In one embodiment, OFDM is used to transfer information over the back channel. In another embodiment, CPM is used to transfer information over the back channel.

Figure 4:
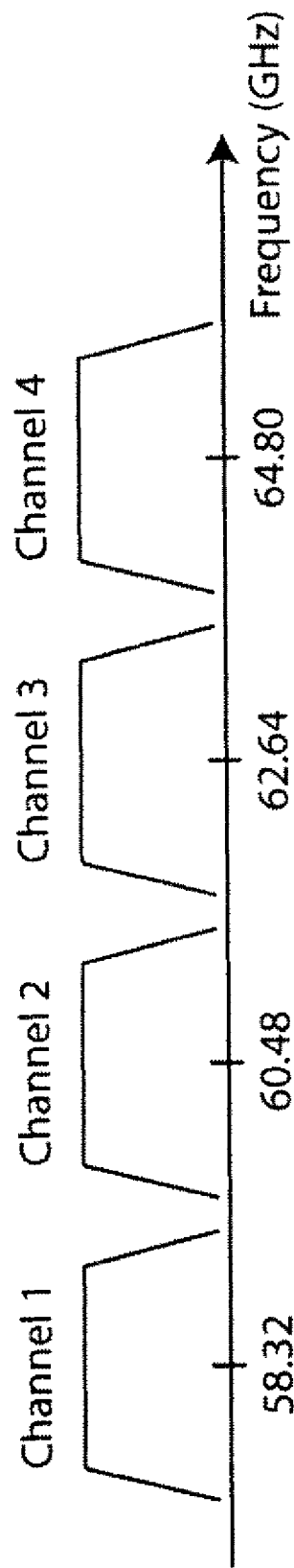
FIG. 4 is a block diagram illustrating one embodiment of end result multiple radio frequency channels.

FIG. 4 illustrates one embodiment of frequency channel plot resulting from the generation circuit previously described. Channel 1 operates at about 58.32 GHz. Channel 2 operates at about 60.48 GHz. Channel 3 operates at about 62.64 GHz. Channel 4 operates at about 64.80 GHz.

In the description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A device comprising:
a single synthesizer;
a frequency divider coupled to the single synthesizer;
a mixer coupled to the single synthesizer and to the frequency divider;
a frequency quadrupler coupled to the mixer; and
a radio frequency (RF) mixer coupled to the frequency quadrupler.

2. The device of claim 1 further comprising:
an IF mixer module coupled to the single synthesizer.

3. The device of claim 2 wherein the IF mixer module comprises an IF mixer and an IF module.

4. The device of claim 2 wherein the IF mixer module comprises an IF filter.

5. The device of claim 2 further comprising:
a processor configured to generate baseband signals;
a digital-to-analog converter (DAC) coupled to the processor to convert the baseband signals to analog signals; and
an analog front end coupled to the DAC to filter and amplify the analog signals, the IF mixer module to receive an output of the analog front end.

6. The device of claim 5 further comprising:
a multiplexer coupled to the RF mixer; and
a plurality of phase shifters coupled to the multiplexer, the multiplexer to control which phase shifter is to receive a signal.

7. The device of claim 6 further comprising:
a plurality of power amplifiers coupled to the plurality of phase shifters; and
a plurality of antennas coupled to the plurality of power amplifiers.

8. The device of claim 6 further comprising:
a control channel to couple the processor to the plurality of phase shifters, the processor to control via the control channel the phase and magnitude of currents in each of the antennas to produce a desired beam pattern.

9. The device of claim 2 further comprising:
an analog front end to receive an output of the IF mixer module to convert an IF signal to a baseband frequency signal;
an analog-to-digital converter (ADC) coupled to the analog front end to convert the baseband frequency signal to a digital signal; and
a processor coupled to the ADC to restore an amplitude and a phase of the digital signal.

10. The device of claim 9 further comprising:
a RF combiner coupled to the RF mixer, the RF mixer configured to generate a fixed IF frequency from multiple frequencies received from the RF combiner; and
a plurality of phase shifters coupled to the RF combiner, the RF combiner to form a single line feed output.

11. The device of claim 10 further comprising:
a plurality of amplifiers coupled to the plurality of phase shifters; and
a plurality of antennas coupled to the plurality of amplifiers.

12. The device of claim 10 further comprising:
a control channel to couple the processor to the plurality of phase shifters, the processor to control via the control channel the phase and magnitude of currents in each of the antennas to receive a desired beam pattern.

13. The device of claim 1 wherein the RF mixer is operable to generate frequency outputs of 58.32 GHz, 60.48 GHZ, 62.64 GHz, and 64.8 GHz with a fixed intermediate frequency.

14. The device of claim 1 wherein the single synthesizer operates at a frequency of about 12.96 GHz.

15. The device of claim 14 wherein the frequency divider is configured to divide by 8, 12, or 24.

16. The device of claim 1 wherein the frequency divider has a divider ratio that is a multiple of two.

17. The device of claim 1 wherein the frequency quadrupler comprises two frequency doublers.

18. The device of claim 1 wherein the mixer includes a single side band mixer.

19. A device comprising:
a processor;
a radio frequency (RF) transmitter coupled to and controlled by the processor to generate frequency outputs at 58.32 GHZ, 60.48 GHZ, 62.64 GHz, and 64.8 GHz, wherein the RF transmitter further comprises
an IF mixer module,
a single synthesizer coupled to the IF mixer module,
a frequency divider coupled to the single synthesizer,
a single side band mixer coupled to the single synthesizer and to the frequency divider, and
a frequency quadrupler coupled to an RF mixer, the RF mixer coupled to the IF mixer module.

20. The device of claim 19 wherein the single synthesizer operates at a frequency of about 12.96 GHz.

21. The device of claim 20 wherein the frequency divider is configured to divide by 8, 12, or 24.

22. The device of claim 19 wherein the RF mixer is configured to generate multiple RF frequencies with a fixed intermediate frequency.

23. The device of claim 19 wherein the RF mixer is configured to generate a fixed intermediate frequency with multiple RF frequencies.

24. The device of claim 19 wherein the device is used for a wireless video area network (WVAN).

25. The device of claim 19 wherein the device is used for a wireless personal area network (WPAN).

26. The device of claim 19 wherein the device is used for a wireless local area network (WLAN).

27. A device comprising:
a single synthesizer;
a frequency divider coupled to the single synthesizer;
a mixer coupled to the single synthesizer and to the frequency divider;
a frequency multiplier coupled to the mixer; and
a radio frequency (RF) mixer coupled to the frequency multiplier.

28. The device of claim 27 wherein the frequency multiplier comprises a quadrupler.

29. The device of claim 27 wherein the frequency multiplier comprises a doubler.

* * * * *